United States Patent
Li et al.

(10) Patent No.: US 7,180,712 B1
(45) Date of Patent: Feb. 20, 2007

(54) SHIELD STRUCTURE DESIGN TO IMPROVE THE STABILITY OF AN MR HEAD

(75) Inventors: Min Li, Fremont, CA (US); Simon H. Liao, Fremont, CA (US); Cheng T. Horng, San Jose, CA (US); Kochan Ju, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/513,873

(22) Filed: Feb. 28, 2000

(51) Int. Cl.
*G11B 5/127* (2006.01)
*G11B 5/33* (2006.01)

(52) U.S. Cl. .................................................. 360/319
(58) Field of Classification Search ................ 360/319, 360/313, 126, 317
See application file for complete search history.

(56) References Cited

U.S. PATENT DOCUMENTS

| | | | |
|---|---|---|---|
| 5,103,553 A * | 4/1992 | Mallary | 29/603.13 |
| 5,108,837 A * | 4/1992 | Mallary | 360/126 |
| 5,621,592 A | 4/1997 | Gill et al. | 360/113 |
| 5,838,521 A | 11/1998 | Ravipati | 360/113 |
| 6,233,116 B1 * | 5/2001 | Chen et al. | 360/126 |
| 6,259,583 B1 * | 7/2001 | Fontana et al. | 360/126 |
| 6,275,360 B1 * | 8/2001 | Nakamoto et al. | 360/317 |
| 6,292,334 B1 * | 9/2001 | Koike et al. | 360/319 |
| 6,437,949 B1 * | 8/2002 | Macken et al. | 360/319 |
| 6,456,467 B1 * | 9/2002 | Mao et al. | 360/319 |
| 6,496,335 B2 * | 12/2002 | Gill | 360/319 |

* cited by examiner

*Primary Examiner*—Angel A. Castro
(74) *Attorney, Agent, or Firm*—Saile Ackerman LLC; Stephen B. Ackerman

(57) ABSTRACT

A method for forming a laminated shield to improve the stability and performance of an MR read head and the MR read head formed using that shield. The shield consists of two layers of ferromagnetic material separated by a layer of ruthenium, allowing the ferromagnetic layers to form an antiferromagnetic configuration by means of a quantum mechanical exchange interaction. The antiferromagnetic configuration has a stable domain structure and a magnetization that forms closed loops around the shield edges thereby reducing noise in the readback signal and reducing disturbances to the magnetic state of the sensor element.

8 Claims, 2 Drawing Sheets

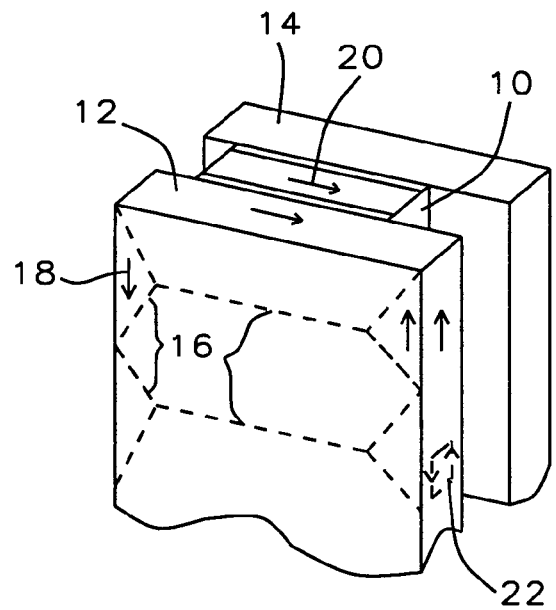
FIG. 1 – Prior Art
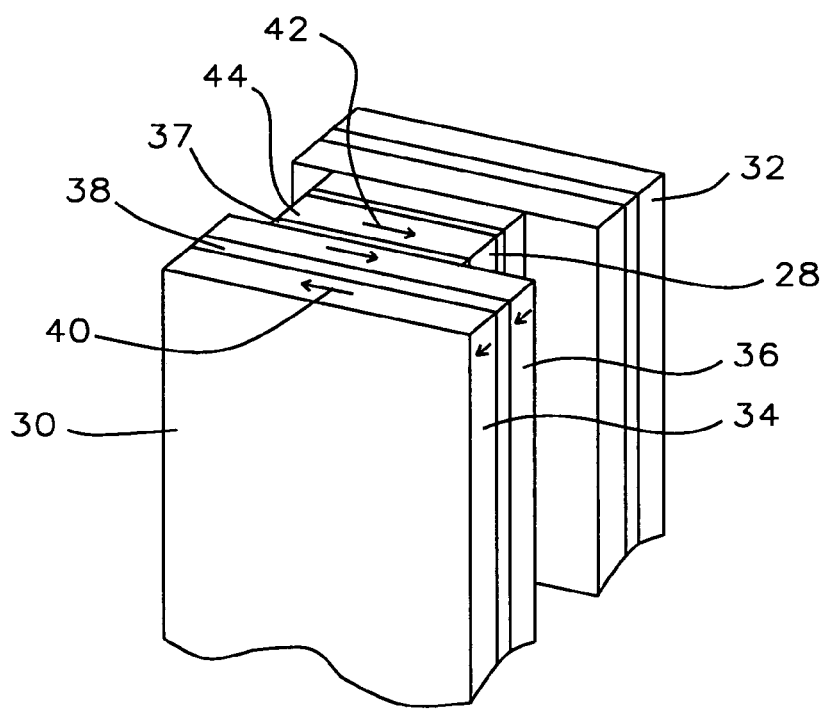
FIG. 2a

SHIELD STRUCTURE DESIGN TO IMPROVE THE STABILITY OF AN MR HEAD

BACKGROUND OF THE INVENTION

1. Field of the Invention

The present invention relates to the fabrication of an MR read head having a laminated magnetic shield structure for improved head stability and performance.

2. Description of the Related Art

A magneto-resistive (MR) read head consists of an MR sensor element that is positioned between two magnetic shields and electrically insulated from them by thin dielectric layers. The read head is typically a part of a combined read/write head assembly which also contains a magnetic inductive write head portion. The purpose of the magnetic shields is to exclude stray magnetic fields from the sensor element. Stray fields, in this context, include such fields as are produced by magnetically encoded data on portions of the magnetic medium not being accessed by the read/write head, as well as fields produced by the write head portion of the read/write assembly during its normal operation.

The operation of magnetic shields can be understood by referring to a simple schematic diagram of an MR sensor and one of its shields as is depicted in FIG. 1. The MR sensor is a device consisting of a lamination of magnetic and non-magnetic layers whose resistance is a function of the angle between the magnetization of the magnetic layers and the direction of current flow through them. A constant flow of current maintained through the sensor then allows variations of its magnetization direction to be sensed as voltage changes, which thereby constitute the readback signal. The sensor is fabricated as part of a combined read/write head assembly which is fabricated as part of a device called a slider and, in turn, is mounted on an actuator assembly. As a magnetic storage medium, such as a hard disk, moves rapidly beneath it, the slider literally flies on a layer of air and is positioned by the actuator at the proper position for reading or writing data on the magnetic medium. The relative motion of medium and slider produces rapidly varying magnetic fields at the sensor. These fields cause the magetization of the sensor to change. Recent types of MR sensors, such as spin valve giant magneto-resistive (SVGMR) sensors, are extremely sensitive to minute variations of a single magnetized layer (the ferromagnetic free layer) of the sensor lamination. As technological advances continue to increase the area density of encoded data on the magnetic medium, the MR sensor must be capable of discriminating between extremely small regions of encoded data, those that it is accessing and those that surround it. It is the task of the magnetic shields to aid in this discriminatory process by eliminating the effects of extraneous magnetic fields to as great a degree as possible, to do so in a reproducible fashion and to further do so without introducing noise into the system. Furthermore, as area densities of encoded data increase, the read gap of the read head must be made correspondingly thinner, which decreases the distance between the MR sensor element and its surrounding shield. This, in turn, increases the interaction between the magnetic properties of the shield and those of the sensor element, exacerbating whatever problems may exist in the shield design.

Magnetic shields fabricated in accordance with the prior art are single layers of magnetic material such as Sendust (FeSiAl). These layers are not magnetized in a substantially single direction (uniaxial anisotropy), but are partitioned into a relatively isotropic pattern of domains, each of which is characterized by it own magnetization direction and bounded by a domain wall structure. When the shield layer is in thermal and mechanical equilibrium, the domains arrange themselves in a pattern of lowest total magnetic energy. The particular domain pattern established in a given shield layer under normal operating conditions depends on many factors, some of which are fixed and some of which are variable. Fixed factors include layer shape, layer dimensions, material composition of the layer and defect structure within the layer. Variable factors include the thermal condition of the layer and its state of mechanical stress resulting from that thermal condition or from factors such as the motion of the head over the rapidly moving disk surface or magnetostriction. Ideally, the shield operates by changing the direction of its magnetization vectors in response to the influence of external magnetic fields. These vectors should return to their original states when the read head is quiescent. Unfortunately, the domain walls often split apart and merge as a result of stress variations. When this occurs, the walls may try to return to their original pattern, but will do so on a time scale that is long compared to the field variations that are being read by the MR sensor. As a result, the sensor is operating in an environment in which the magnetic structure of its shields is changing. The changing domain structure of the shields as well as the variations in its magnetization produced by the fields in its environment induces eddy currents within those shields, which can itself generate further local stresses. In addition, the changing domain structure induces a noisy signal in the MR sensor, producing what is called Barkhausen noise in the sensor's readout signal. A final, but by no means less significant disadvantage of the relatively isotropic arrangement of magnetizations of a typical shield, is that it makes it difficult to maintain the fixed bias of the magnetization of the MR sensor element itself. In order for the sensor element to operate in an optimal portion of its response curve (i.e. response of its resistance to the external magnetic field), the sensor's magnetization is "biased," or fixed in a direction in the plane of its air-bearing surface. This biasing is typically accomplished by magnetic layers that are formed integrally with the sensor element during its fabrication. It would be of great importance that the dominant magnetization of the shield be in the same direction as the desired bias direction of the sensor.

It is clear, therefore, that the performance of magnetic shields can be substantially improved if their domain structure can be stabilized and their magnetization made maximally uniaxial. One way to do this, is by "pinning" the magnetization of the shield material so that it assumes a fixed direction (uniaxial anisotropy) to which it returns during the operation of the read/write head assembly. The invention of Gill et al. (U.S. Pat. No. 5,621,592) teaches a method of forming a magnetic shield with substantial uniaxial anisotropy by laminating a ferromagnetic layer of NiFe with an antiferromagnetic layer of NiMn. The antiferromagnetic layer pins the magnetization of the ferromagnetic layer by exchange coupling, so that the magnetization of the ferromagnetic layer has a very strong tendency to rotate back to its easy axis after responding to fields that rotate it away from that axis.

In a somewhat different vein, the invention of Ravipati (U.S. Pat. No. 5,838,521) teaches a method of forming a laminated shield in a tri-layer configuration, in which two layers of ferromagnetic material such as NiFe are separated by an equally thick layer of non-magnetic material, such as tantalum. The two ferromagnetic layers are formed with their uniaxial magnetizations parallel, but oppositely directed. Particular advantages of this shield configuration are: 1) that there is a single domain that is substantially coextensive with the planar surface of the shield and, 2) magnetization vectors of the respective layers, being oppositely directed, form closed paths encompassing both layers. This closure tends to reduce the occurrence of eddy currents in the shield.

It has been relatively recently discovered that magnetic multilayers, in which layers of ferromagnetic material are separated by very thin layers of non-magnetic material, exhibit an unusual form of oscillatory exchange coupling that depends critically on the thickness of the non-magnetic layer. As the thickness of the non-magnetic layer is varied, the two ferromagnetic layers will change from an antiferromagnetic coupling, in which their magnetizations are pinned in opposite directions, to a ferromagnetic coupling, in which their magnetizations are parallel and in the same direction. The explanation for this phenomenon is that the non-magnetic layer forms a trapping channel for conduction electrons due to spin dependent scattering from its interfaces with the ferromagnetic material. The trapping channel thereby serves as a quantum well whose spin-polarized energy levels are a function of the width of the non-magnetic layer. As the thickness of the non-magnetic layer is increased, the energy levels shift until the Fermi level is crossed, at which point the interaction between the two ferromagnetic layers will change from antiferromagnetic to ferromagnetic. This form of quantum mechanical exchange coupling provides an extremely effective mechanism for the formation of a magnetic shield of great stability. It is the object of the present invention to teach a method of forming a laminated tri-layer shield that is pinned in an antiferromagnetic configuration by means of the quantum mechanical oscillatory exchange coupling discussed above.

SUMMARY OF THE INVENTION

A first object of this invention is to provide an MR read head capable of decoding information stored on magnetic media with high area density and narrow trackwidths.

A second object of this invention is to provide an MR read head with improved electrical, magnetic, mechanical and thermal stability.

A third object of the present invention is to provide an MR read head with improved noise characteristics of the readback signal.

These objects will be achieved by providing a laminated magnetic shield for the MR sensor element, said shield having a stable domain structure that is substantially uniaxially anisotropic and closed at its edges. Said shield consists of two layers of ferromagnetic material in a mutually antiferromagnetic configuration separated by a layer of ruthenium (Ru) formed to a specific thickness so as to fix the antiferromagnetic configuration by quantum mechanical exchange coupling. The stability of the exchange-coupled system eliminates noise caused by variations in the domain structure while the domain closure loop naturally formed at the edges tends to reduce the occurrence of eddy currents. The uniaxial magnetic anisotropy of each ferromagnetic layers is maintained by the exchange coupling and causes its magnetization to rotate back to its easy axis direction after perturbation by external fields. This property helps to maintain the magnetic bias of the sensor element, increasing its stability and allowing it to continue to operate in the most linear portion of its response curve. Due to the coupling of the two layers, the rotation of their magnetization is coherent and their hysteresis is reduced under the action of external fields produced by the encoded media or the write portion of the read/write head assembly.

BRIEF DESCRIPTION OF THE DRAWINGS

The objects, features and advantages of the present invention are understood within the context of the Description of the Preferred Embodiment as set forth below. The Description of the Preferred Embodiment is understood within the context of the accompanying figures, wherein:

FIG. 1 shows a schematic diagram of an MR sensor and its magnetic shields fabricated in accordance with the prior art and indicating a typical domain structure in one of its shields.

FIG. 2a shows an MR read head comprising an MR sensor element between two laminated tri-layer shield structures formed in accordance with the methods and objects of the present invention. The shield structures each consists of two ferromagnetic layers separated by a non-magnetic Ru layer of specific thickness.

DESCRIPTION OF THE PREFERRED EMBODIMENT

Figure 2B:
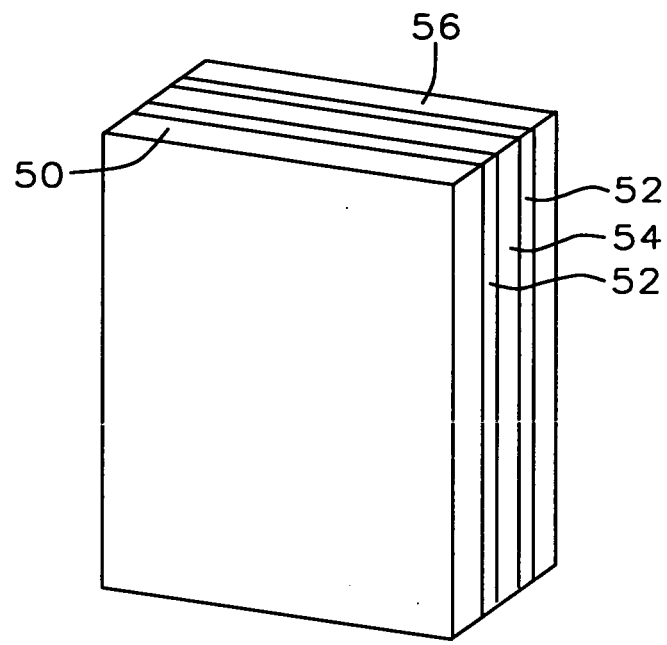
FIG. 2b shows a single laminated shield structure fabricated according to another embodiment of the present invention, in which the ruthenium layer is formed between two CoFe layers.

The present invention provides a laminated magnetic shield structure whose design improves the stability and performance of an MR read head. Referring first to FIG. 1, there is shown a schematic drawing of a MR sensor element (10) and its surrounding magnetic shields (12) and (14) fabricated in accordance with the present art. The shields are typically formed of a single ferromagnetic layer and display a domain structure (16) that is substantially isotropic and subject to noise producing variations during the operation of the shield. The magnetizations of the various domains (18) are not aligned in the direction of the magnetic layer of the sensor element (20) and, therefore, do not assist in maintaining a consistent orientation of the sensor magnetization. The movement of the shield magnetic moments tend to cause eddy currents to form in the edges of the shield (22).

Referring now to FIG. 2a, there is shown a schematic drawing of an MR sensor element (28) and its surrounding magnetic shields (30) and (32), each fabricated in accordance with the methods of the present invention. In this preferred embodiment, the MR sensor element (28) could be a spin valve type of giant magnetoresistive (SVGMR) sensor (whose detailed structure is not indicated in this figure), having a free ferromagnetic layer (44) that interacts with the fields produced by magnetically encoded data. Each of the surrounding shields consists of two layers of ferromagnetic material (34) and (36), which in one preferred embodiment are layers of NiFe approximately 1 micron in thickness, but which could be between 0.5 microns and 2.0 microns in thickness and could also be composed of CoFeNi, FeAlSi or CoZrNb of the same thickness range. The lower layer (34) of the lower shield (30) is formed on a substrate of $Al_2O_3$ (not shown), while its upper layer (36) is separated from the MR sensor element by a dielectric layer (37) composed of materials selected from a group consisting of, but not restricted to, $Al_2O_3$, $SiO_2$, AlN, and SiN, and having a thickness between 1,000 angstroms and 2,000 angstroms. The upper shield (32) is similarly separated from the MR sensor element by a dielectric layer (39).

The ferromagnetic layers (34) and (36), are separated by a layer of ruthenium (Ru) (38), which can be of thickness between 6 angstroms and 10 angstroms or between 2 angstroms and 4 angstroms. The choice of ruthenium and its precise thickness is critical to producing the quantum mechanical exchange coupling between the ferromagnetic layers, thereby allowing them to exist in a stable antiferromagnetic configuration of oppositely directed magnetizations (40) and (42). The free ferromagnetic layer (44) of the MR sensor element (28) has its magnetization aligned in the same direction as the ferromagnetic layer (36) closest to it.

An alternative embodiment of the present invention increases the exchange energy between the ferromagnetic layers by using a Ru layer of thickness between 2 angstroms and 4 angstroms. This embodiment is schematically similar to that depicted in FIG. 2a except for the different thickness of the ruthenium layer (38).

Referring now to FIG. 2b, there is shown a schematic of an individual shield structure fabricated in accordance with yet another embodiment of the present invention. In this embodiment, a layer of CoFe (52) of thickness between 20 angstroms and 50 angstroms is formed on the first ferromagnetic layer (50), a layer of Ru (54) of thickness between 6 angstroms and 10 angstroms, or between 2 angstroms and 4 angstroms, is formed on the CoFe layer (52), a second CoFe layer (52), identical to the first, is formed on the Ru layer and a second ferromagnetic layer (56) is formed on the second CoFe layer (52). The insertion of the CoFe layer at each interface between the Ru layer and the ferromagnetic layer is a mechanism for increasing the exchange energy.

Figure 3:
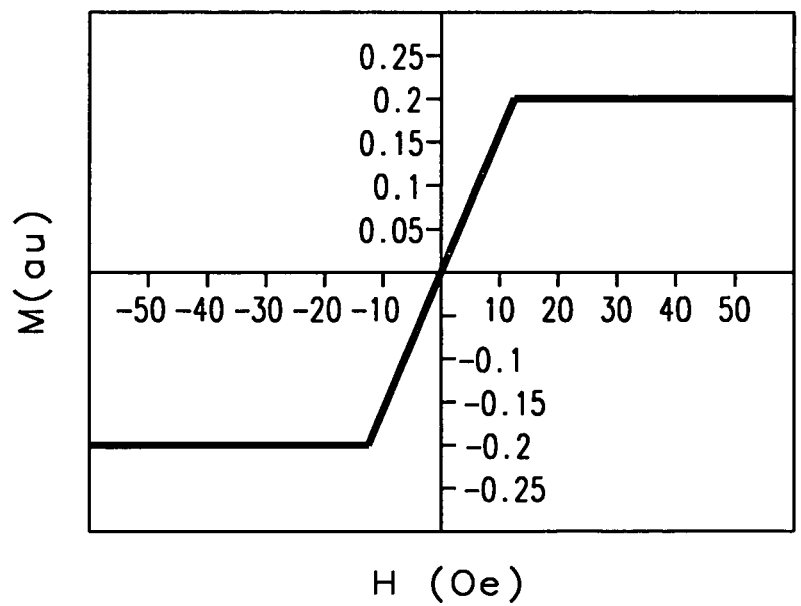
FIG. 3 shows a graph of magnetization (M) vs. applied field (H) for an embodiment of the shield configuration of the present invention similar to that depicted in FIG. 2b.

Referring now to FIG. 3, there is shown a graph of the relationship between the strength of an external H field (in oersteds (Oe)) and the resulting magnetization (in arbitrary units (au)) of a shield structure similar to that in the embodiment of the present invention depicted in FIG. 2b, consisting of:

NiFe (1 micron)/CoFe/Ru/CoFe/NiFe (1 micron)

calculated with the coherent rotation model. As can be seen from the graph, this structure would have an effective saturation field of 8 Oe to 16 Oe.

As is understood by a person skilled in the art, the preferred embodiment of the present invention is illustrative of the present invention rather than limiting of the present invention. Revisions and modifications may be made to methods, materials, structures and dimensions employed in the fabrication of a laminated magnetic shield structure whose design improves the stability and performance of an MR read head in accord with the preferred embodiment of the present invention, while still providing a method for fabricating such a laminated magnetic shield structure whose design improves the stability and performance of an MR read head together with the laminated magnetic shield structure so fabricated, in accord with the spirit and scope of the present invention as defined by the appended claims.

What is claimed is:

1. A method for fabricating a laminated magnetic shield for an MR read head comprising:
   providing a substrate;
   forming on said substrate a layer of $Al_2O_3$ of thickness between 0.5 microns and 10.0 microns;
   forming on said $Al_2O_3$ layer a first layer of ferromagnetic material;
   forming on said first layer of ferromagnetic material a layer of ruthenium;
   forming on said layer of ruthenium a second layer of ferromagnetic material;
   forming on said second layer of ferromagnetic material a dielectric layer;
   wherein the layer of ruthenium is of thickness between 2.0 angstroms and 4.0 angstroms.

2. A method for fabricating a laminated magnetic shield for an MR read head comprising:
   providing a substrate;
   forming on said substrate a first layer of ferromagnetic material;
   forming on said first layer of ferromagnetic material a first layer of CoFe;
   forming on said first layer of CoFe a layer of ruthenium (Ru);
   forming on said layer of ruthenium a second layer of CoFe;
   forming on said second layer of CoFe a second layer of ferromagnetic material;
   forming on said second layer of ferromagnetic material a dielectric layer;
   wherein the layer of ruthenium is of thickness between 2.0 angstroms and 4.0 angstroms.

3. A laminated magnetic shield for an MR read head comprising:
   a substrate;
   a layer of $Al_2O_3$ of thickness between 0.5 microns and 10.0 microns formed on said substrate;
   a first layer of ferromagnetic material formed on said layer of $Al_2O_3$;
   a layer of ruthenium formed on said first layer of ferromagnetic material;
   a second layer of ferromagnetic material formed on said layer of ruthenium;
   a dielectric layer formed on said second layer of ferromagnetic material;
   wherein the layer of ruthenium is of thickness between 2.0 angstroms and 4.0 angstroms.

4. A laminated magnetic shield for an MR read head comprising:
   a substrate;
   a first layer of ferromagnetic material formed on said substrate;
   a first layer of CoFe formed on said first layer of ferromagnetic material;
   a layer of ruthenium formed on said first layer of CoFe;
   a second layer of CoFe formed on said layer of ruthenium;
   a second layer of ferromagnetic material formed on said second layer of CoFe;
   a dielectric layer formed on said second layer of ferromagnetic material;
   wherein the layer of ruthenium is of thickness between 2.0 angstroms and 4.0 angstroms.

5. A magnetoresistive read head with laminated magnetic shields comprising:
   a first laminated magnetic shield;
   a magnetoresistive sensor element formed on said first laminated magnetic shield;
   a second laminated magnetic shield formed on said magnetoresistive sensor;
   wherein the first laminated magnetic shield comprises:
      a substrate;
      a layer of $Al_2O_3$ of thickness between 0.5 microns and 10.0 microns formed on said substrate;

a first layer of ferromagnetic material formed on said layer of $Al_2O_3$;

a layer of ruthenium formed on said first layer of ferromagnetic material;

a second layer of ferromagnetic material formed on said layer of ruthenium;

a dielectric layer formed on said second layer of ferromagnetic material;

wherein the layer of ruthenium is of thickness between 2.0 angstroms and 4.0 angstroms.

6. A magnetoresistive read head with laminated magnetic shields comprising:

a first laminated magnetic shield;

a magnetoresistive sensor element formed on said first laminated magnetic shield;

a second laminated magnetic shield formed on said magnetoresistive sensor element;

wherein the first laminated magnetic shield comprises:
   a substrate;
   a first layer of ferromagnetic material formed on said substrate;
   a first layer of CoFe formed on said first layer of ferromagnetic material;
   a layer of ruthenium formed on said first layer of CoFe;
   a second layer of CoFe formed on said layer of ruthenium;
   a second layer of ferromagnetic material formed on said second layer of CoFe;
   a dielectric layer formed on said second layer of ferromagnetic material;
   wherein the layer of ruthenium is of thickness between 2.0 angstroms and 4.0 angstroms.

7. A magnetoresistive read head with laminated magnetic shields comprising:

a first laminated magnetic shield;

a magnetoresistive sensor element formed on said first laminated magnetic shield;

a second laminated magnetic shield formed on said magnetoresistive sensor element;

wherein the second laminated magnetic shield comprises:
   a substrate;
   a layer of $Al_2O_3$ of thickness between 0.5 microns and 10.0 microns formed on said substrate;
   a first layer of ferromagnetic material formed on said layer of $Al_2O_3$;
   a layer of ruthenium formed on said first layer of ferromagnetic material;
   a second layer of ferromagnetic material formed on said layer of ruthenium;
   a dielectric layer formed on said second layer of ferromagnetic material;
   wherein the layer of ruthenium is of thickness between 2.0 angstroms and 4.0 angstroms.

8. A magnetoresistive read head with laminated magnetic shields comprising:

a first laminated magnetic shield;

a magnetoresistive sensor element formed on said first laminated magnetic shield;

a second laminated magnetic shield formed on said magnetoresistive sensor element;

wherein the second laminated magnetic shield comprises:
   a substrate;
   a first layer of ferromagnetic material formed on said substrate;
   a first layer of CoFe formed on said first layer of ferromagnetic material;
   a layer of ruthenium formed on said first layer of CoFe;
   a second layer of CoFe formed on said layer of ruthenium;
   a second layer of ferromagnetic material formed on said second layer of CoFe;
   a dielectric layer formed on said second layer of ferromagnetic material;
   wherein the layer of ruthenium is of thickness between 2.0 angstroms and 4.0 angstroms.

* * * * *